(12) United States Patent
Heinrich-Barna et al.

(10) Patent No.: US 7,379,354 B2
(45) Date of Patent: May 27, 2008

(54) METHODS AND APPARATUS TO PROVIDE VOLTAGE CONTROL FOR SRAM WRITE ASSIST CIRCUITS

(75) Inventors: Stephen Keith Heinrich-Barna, Murphy, TX (US); Jonathon Barry Miller, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 255 days.

(21) Appl. No.: 11/435,247

(22) Filed: May 16, 2006

(65) Prior Publication Data

US 2007/0268738 A1 Nov. 22, 2007

(51) Int. Cl.
*G11C 7/12* (2006.01)
*G11C 5/14* (2006.01)

(52) U.S. Cl. .................. 365/189.16; 365/189.09; 365/204; 365/195; 365/194; 365/156

(58) Field of Classification Search ............... 365/156, 365/154, 189.16, 204, 194, 195, 189.09
See application file for complete search history.

(56) References Cited

U.S. PATENT DOCUMENTS 6,671,201 B2 * 12/2003 Masuda ............... 365/154
6,751,152 B2 * 6/2004 Hsu et al. ............. 365/230.06
2007/0081379 A1 * 4/2007 Clinton et al. ........... 365/149
2007/0268738 A1 * 11/2007 Heinrich-Barna et al. .. 365/149

OTHER PUBLICATIONS

U.S. Appl. No. 11/234,346 entitled "Write Assist for Latch and Memory Circuit", filed Sep. 23, 2005, 22 pages.

* cited by examiner

*Primary Examiner*—Andrew Q Tran
(74) *Attorney, Agent, or Firm*—Alan K. Stewart; W. James Brady; Frederick J. Telecky, Jr.

(57) ABSTRACT

Methods and apparatus to control voltage output of a write assist circuit are disclosed. An example method includes regulating pull down voltage from a write assist circuit having a write assist capacitor coupled to a discharge node coupled to a bit line. The write assist circuit further includes a transistor to receive an enable signal to couple the bit line to a low voltage rail. A voltage source is provided to charge the capacitor. The voltage produced by the voltage source is limited to limit the pull down voltage at the discharge node from the write assist capacitor.

26 Claims, 4 Drawing Sheets

METHODS AND APPARATUS TO PROVIDE VOLTAGE CONTROL FOR SRAM WRITE ASSIST CIRCUITS

FIELD OF THE DISCLOSURE

This disclosure relates generally to memory devices and, more particularly, to methods and apparatus to facilitate voltage control of a write assist circuit for an SRAM device.

BACKGROUND

Static random access memory (SRAM) is a common memory device that does not require constant refresh to retain stored data. An example SRAM has multiple cells that are made of six transistors, such as metal oxide semiconductor (MOS) transistors. The example cell has two cross-coupled inverters that form a latch circuit. The latch is coupled between high and low voltage rails. The inverters are coupled to corresponding access transistors. The latch is connected between a high storage node and a low storage node. Each of the storage nodes is coupled to a bit line or a complementary bit line via an access transistor. The gate terminals of the access transistors are connected to a word line. The storage nodes are insulated when the access terminals are deactivated by applying a low voltage to the wordline thus allowing the cell to hold the data without refresh.

In order to write data into the cell, the access terminals are coupled to a write driver which discharges the bit line. A high voltage is applied to the wordline of the desired cell to be written. The write occurs when a low voltage is applied to the access terminal of one of the access transistors. As a result of discharging the bit line, the latch flips to a different state and holds the opposite high or low storage node.

As integrated circuits have increased in gate density and complexity, lower power requirements for the circuits are desirable. As a result, designers have sought to lower the high voltage required on integrated circuit designs. The lowering of the voltage requirements in circuit designs has made it more difficult to operate SRAM circuits due to the need to ensure a stable cell while at the same time allowing the cell to be writeable. In order to ensure operation of SRAM circuits using lower operating voltages, designers employ a write assist circuit. A write assist circuit uses a capacitor to pull the voltage on the access terminals below the low voltage to a level which is lower than the point at which the cell changes state. This level can be negative, but is not required to be so. By giving a larger range to the discharge level, the circuit thus allows an SRAM cell to be developed with good stability while retaining a robust ability to be written.

However, due to the wide range of operating conditions of SRAM circuits such as usage, voltages, temperatures, etc., write assist circuits produce a wide range of voltages. The range of voltages can result in adverse performance. For example, if the voltage is too negative, latch up may occur and other unintended bit lines may be discharged (bit cell disturbs). On the other hand, if the voltage is too close to the trip point of the cell, the bit cell will not write over all operating conditions. The problems of the wide range of voltages provided by write assist circuits are increased with the use of circuits such as the SmartReflex device by Texas Instruments, which adapts the voltage of a circuit based on operating conditions. The wide range of voltages results in difficulties in controlling the voltages output by write assist circuits.

DETAILED DESCRIPTION

An example method disclosed herein includes regulating pull down voltage from a write assist circuit having a write assist capacitor coupled to a discharge node coupled to a bit line. The write assist circuit further includes a transistor to receive an enable signal to couple the bit line to a low voltage rail. A voltage source is provided to charge the capacitor. The voltage produced by the voltage source is limited to limit the pull down voltage at the discharge node from the write assist capacitor.

Another example disclosed method includes regulating negative voltage from a write assist circuit having a write assist capacitor coupled to a discharge node that is coupled to a bit line. The write assist circuit also includes a transistor to receive an enable signal to couple the bit line to a low voltage rail. A voltage source is provided to charge the write assist capacitor. The charge provided to the write assist capacitor is limited.

Another example is a write assist circuit for use in conjunction with a write enable signal to SRAM. The circuit has a bit access line coupled to a bit cell. The bit access line activates a write command to the bit cell. A bit line capacitor is coupled to the bit access line. A discharge node is held at the voltage of a high voltage rail coupled to the bit access line. A transistor is coupled between a discharge node and a low voltage rail. The transistor couples the bit access line to the low voltage rail activating a write to the bit cell on receiving the write enable signal. A write assist capacitor is coupled to the discharge node to pull the discharge node to a pull down voltage below the voltage of the low voltage rail. A circuit is coupled to the write assist capacitor to vary the charge of the write assist capacitor and control the pull down voltage.

Another example is a write assist circuit for use with an SRAM device with a bit access line held at a high voltage. The access line activates a write to a bit cell with an activation signal to discharge the bit line to a discharge node. The write assist circuit includes a write assist capacitor coupled to the discharge node. A transistor is coupled between the discharge node and a low voltage rail. A voltage circuit receives the activation signal and is coupled to the write assist capacitor to limit the voltage to charge the write assist capacitor to pull down the discharge node below the voltage of the low voltage rail.

Figure 1:
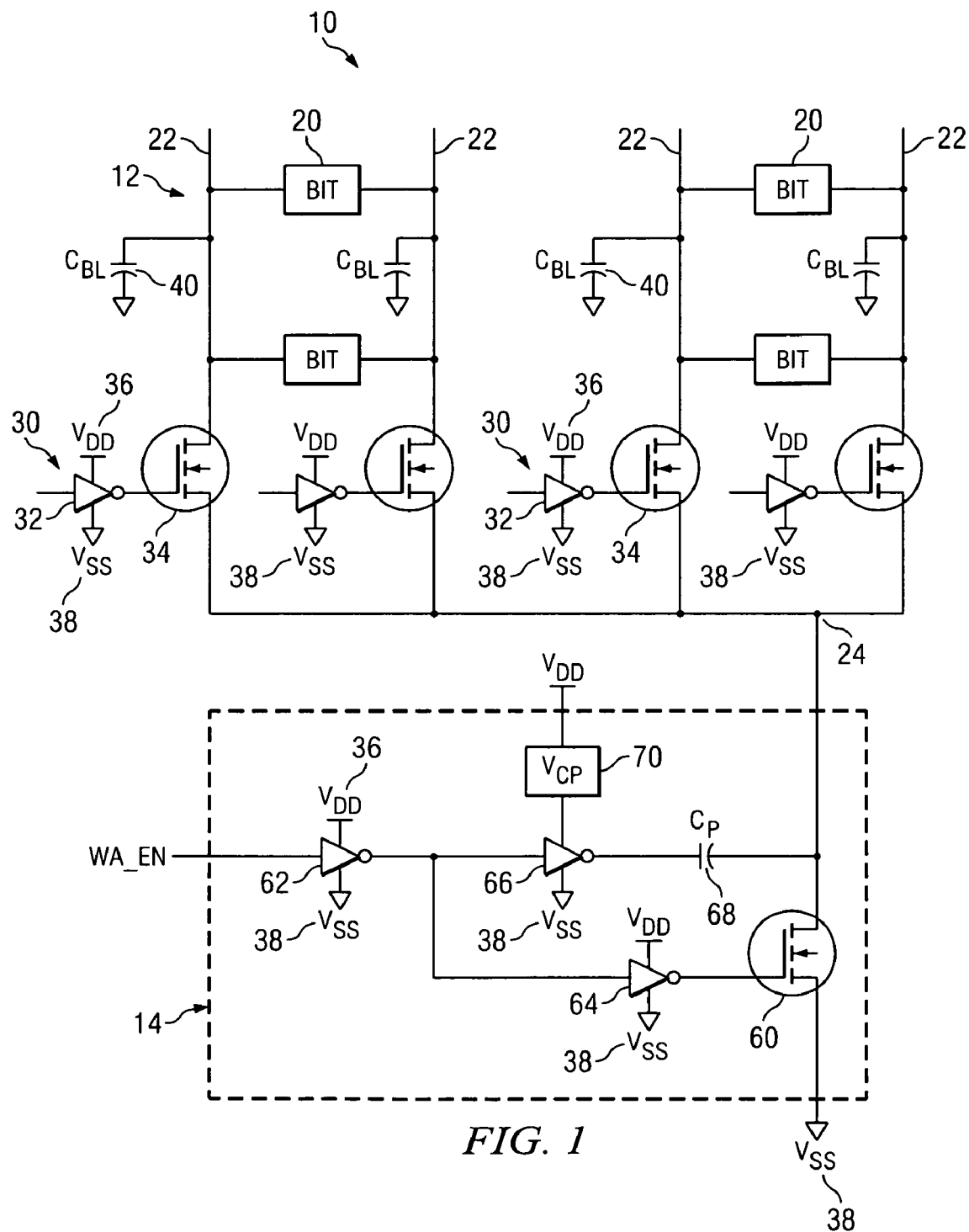
FIG. 1 is a circuit diagram of portion of an example SRAM device including an example regulated voltage write assist circuit using a voltage regulator.

FIG. 1 is a circuit diagram of an example memory circuit 10, which includes a memory block 12 and a voltage controlled write assist circuit 14. In one implementation, the memory circuit may be an SRAM memory circuit. The memory circuit 10 in this example is designed to operate under relative low operating voltages and, thus, uses the write assist circuit 14 to apply negative voltages to activate bit cells when writing data. As explained below, the write assist circuit 14 controls the pull down voltages that are applied to avoid extreme variations in voltage of the access terminal signals required to write the memory cells.

The memory block 12 has multiple bit cells 20 for storing data. The bit cells 20 are coupled between two bit lines 22. Each bit line 22 is coupled to a discharge node 24 through a respective write driver 30. Each write driver 30 includes an inverter 32 which is coupled to drive the gate of a transistor 34. In this example, the transistor 34 is an n-channel metal oxide semiconductor (NMOS) gate, although those of ordinary skill in the art will recognize that other types of transistors such as metal oxide semiconductor field effect transistors (MOSFETs) or p-channel MOS (PMOS) transistors may be used for the transistor 34. The inverter 32 is powered by connection to a high voltage rail 36 ($V_{DD}$) and by either a low voltage rail ($V_{SS}$) 38 or the discharge node 24.

The transistor 34 is coupled between the bit line 22 and the discharge node 24. The bit cells 20 correspond to rows of a memory array with each respective bit line 22 corresponding to a respective column of the memory array. In this example, the bit cells 20 each include a latch system connected between a pair of access transistors (not shown) that are controlled by a word line to selectively couple or isolate the latch systems to the respective bit lines 22 in order to read the memory array. A bit line capacitor 40 is coupled to each of the bit lines 22 and maintains the bit lines 22 at a precharged voltage level close to the voltage level of the high voltage rail 36.

In order to write data, a column select signal is applied to the write driver 30 coupled to the memory cells such as the bit cells 20 into which information is written. In the illustrated example, the column select signal is a low signal which will be inverted by the inverter 32 to send a high signal to the gate of the transistor 34. The high gate signal at the transistor 34 saturates the transistor 34 to couple the selected bit line 22 to the discharge node 24. The voltage stored in the bit line capacitor 40 is thus discharged toward the discharge node 24 enabling information to be written to the bit cell 20.

The write assist circuit 14, which, as noted above is coupled to the discharge node 24, is activated by a write enable signal (WA_EN) which is typically part of a timing signal that is asserted during a write operation with the column select signal. The write enable circuit 14 includes a transistor 60 which is coupled to the low voltage rail 38 ($V_{SS}$). The write signal will activate the transistor 60 of the write enable circuit 14 to couple the discharge node 24 to the low voltage rail 38 thus discharging the bit line capacitor 40 to the low voltage rail 38. The gate of the transistor 60 is coupled to two inverters 62 and 64. The output of the inverter 62, which is the inverted write enable signal, is coupled to the input of the inverter 64 and an inverter 66. A write assist capacitor 68 is coupled between the inverter 66 and the drain of the transistor 60. Those of ordinary skill in the art will understanding that the write assist capacitor 68 may be the parasitic capacitance of the gate to drain junction of the transistor 60.

The write assist circuit 14 is activated by a write enable signal input to the inverter 62. Normally, a low write enable signal is supplied to the inverter 62 and thus the gate of the transistor 60. In such a case, the transistor 60 is off. When a high write enable signal is supplied on the input of the inverter 62, the output of the inverter 62 is low. The low output from the inverter 62 is coupled to the input of the inverter 64, which in turn produces a high output signal to the gate of the transistor 60. This causes the transistor 60 to couple the bit line 22 to the low voltage rail 38 and the discharge node 24 is discharged toward voltage of the low voltage rail 38. The low output from the inverter 62 is also coupled to the input of the inverter 68 which outputs a high signal to the write assist capacitor 68. The write assist enable high signal is delayed from the write assist capacitor 68 by the two inverters 62 and 66. After the delay of the signal, the write enable signal is changed to low, which turns off the transistor 60 thereby removing $V_{cp}$ for the write assist capacitor 68 in favor of the low voltage rail 38 and removing the ground from the other end of the write assist capacitor 68. This causes the write assist capacitor 68 to discharge, generating a pull down voltage to bring the discharge node 24 to a negative voltage ($V_{neg}$) which is lower than the voltage of the low voltage rail 38 by the amount of voltage previously stored in the write assist capacitor 68.

The negative voltage generated by the capacitor 68 on the discharge node 24 is a function of the voltage powering the inverter 66 and the proportion of the write assist capacitor 68 (i.e., $V_{cp}$) and the bit line capacitor 40 according to the equation:

$$V_{neg} = V_{cp} \times Cp/(C_{BL}+Cp)$$

The value of the negative voltage coupled to the discharge node 24 is thus be controlled by changing the capacitive value of the write assist capacitor 68 and/or the voltage used to charge the capacitor 68 (i.e., $V_{cp}$). The voltage powering the inverter 66 is controlled by a voltage regulation circuit 70. The amount of voltage supplied by the voltage regulation circuit 70 thus controls the negative voltage. The voltage regulation circuit 70 may be powered by the high voltage rail 36 or in order to achieve greater control may have an independent power source. The independent power source may be contained within the circuit or may be provided externally. The amount of voltage supplied by the voltage regulation circuit 70 and thereby the negative voltage supplied by the write assist capacitor 68 may be dependent on factors such as temperature in order to insure a negative voltage which is not too low relative to the voltage of the high voltage rail 36 which prevents activation of the write function, or too high relative to the voltage of the high voltage rail 36 which could result in over latching and/or unintended activation of other bit lines.

Figure 2:
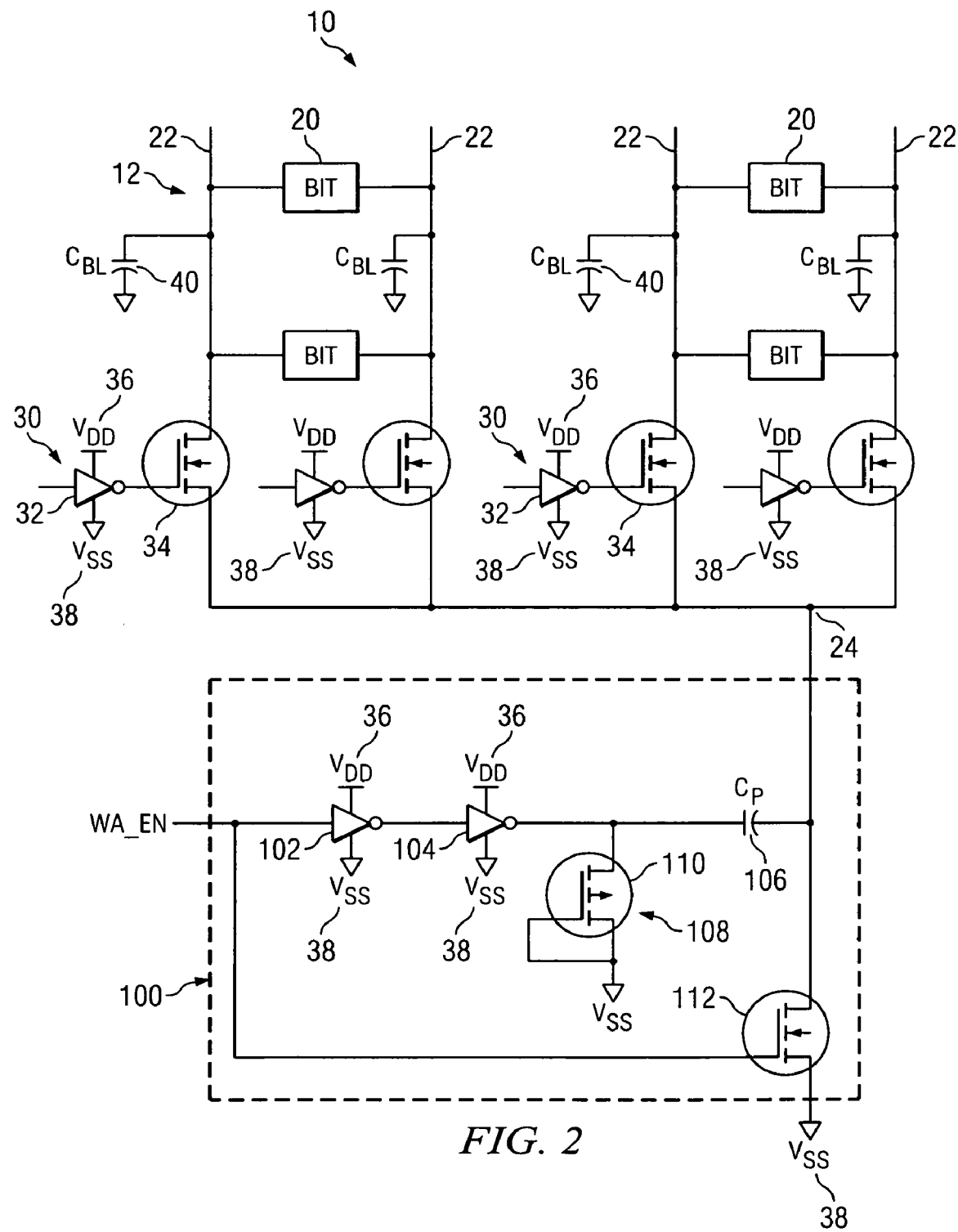
FIG. 2 is a circuit diagram of portion of an example SRAM device of another example regulated voltage write assist circuit using a capacitor circuit.

FIG. 2 shows another example of a voltage regulated write assist circuit 100. The write assist circuit 100 is coupled to a discharge node 24 of a memory circuit 12, which is identical to that in FIG. 1. Identical elements in FIG. 2 have identical element numbers to their counterparts in FIG. 1. The write assist circuit 100 has a pair of inverters 102 and 104 that are coupled to a write assist capacitor 106. The write assist capacitor 106 is also coupled to a capacitor charging control circuit 108. The control circuit 108 has a field effect transistor (FET) 110 which in this example is a p-type MOS. The FET 110 has its gate and drain tied to the low voltage rail 38. When the voltage to the write assist capacitor 106 exceeds the threshold voltage at the source of the FET 110, the FET 110 will conduct current and act as a voltage divider. The control circuit 108 thus limits the amount of charge that may be stored by the write assist capacitor 106 and thus limits the negative voltage supplied by the write assist circuit 100 to the discharge node 24. Those of ordinary skill in the art will recognize that the transistor 110 may be implemented using various other circuits including, but not limited to, a PN junction, PMOS device, bipolar devices, or more complex regulation circuits having a limiting voltage supplied either internally or externally to the write assist circuit 100.

The write assist circuit 100 functions similarly to the write assist circuit 14 in FIG. 1. While a column select signal activates the write driver 30 of a selected bit line 20, a high write enable signal turns on a transistor 112 which places FET 110 in parallel with the write assist capacitor 106. The transistor 112 couples the discharge node 24 to the low voltage rail 38. The inverters 102 and 104 delay the charging of the write assist capacitor 106 from the write enable signal. Once the capacitor 106 is charged, a low write enable signal turns off the transistor 112 and the capacitor 106 discharges, pulling the discharge node 24 to a negative voltage below the voltage of the low voltage rail 38 due to the voltage stored in the write assist capacitor 106. The magnitude of the negative voltage is controlled because the control circuit 108 prevents full charging of the write assist capacitor 106 because these two circuit elements are in parallel.

Figure 3:
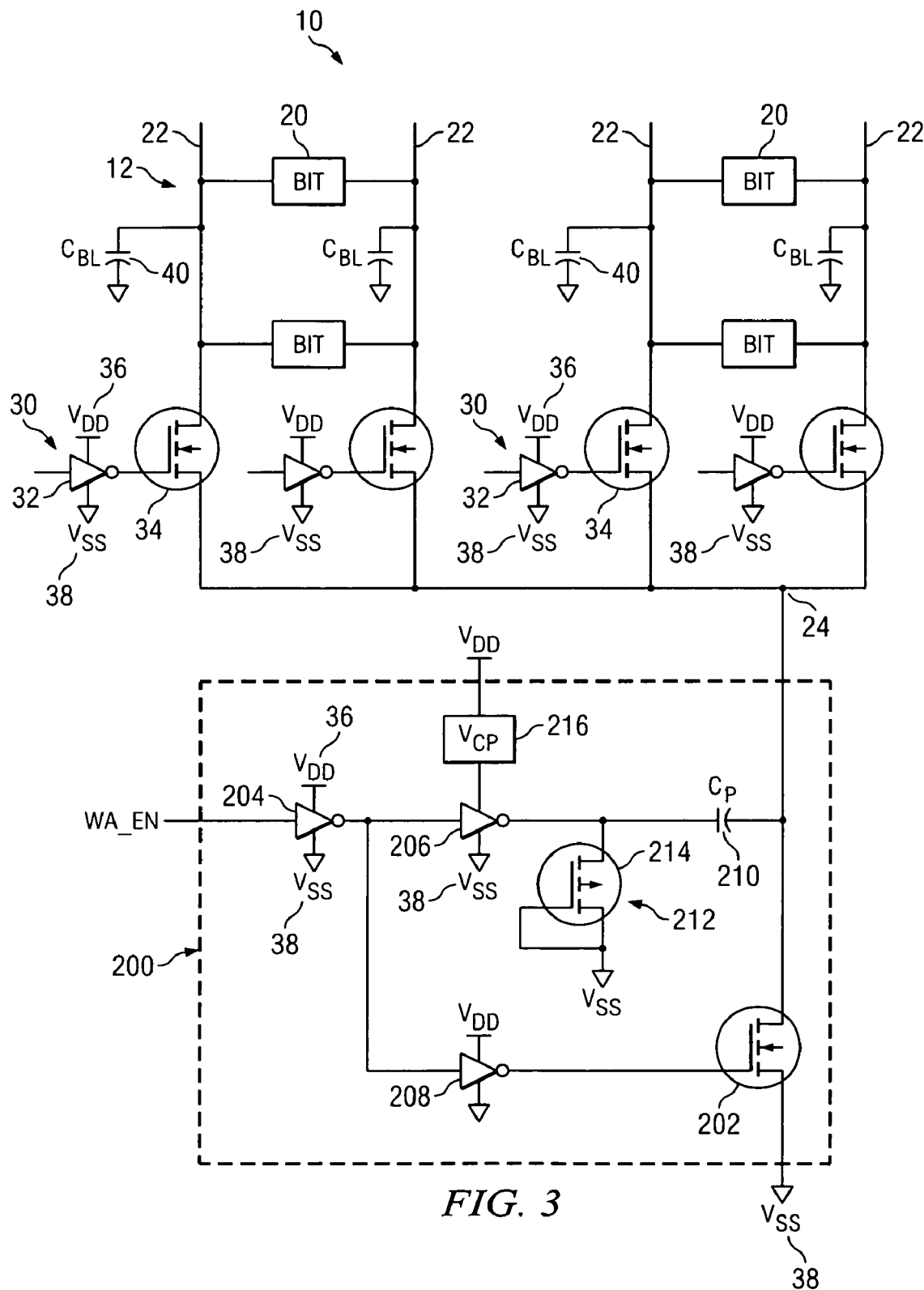
FIG. 3 is a circuit diagram of portion of an example SRAM device of another example regulated voltage write assist circuit using both a capacitor circuit and a voltage regulator.

FIG. 3 is another example of a write assist circuit 200 which provides regulation of the negative assist voltage to a memory block 12 which is identical to that in FIG. 1. The memory block 12 has identical elements to the memory block 12 in FIG. 1 and has identical element numbers. The write assist circuit 200 uses a combination of capacitor control as the write assist circuit 100 in FIG. 2 and voltage regulation as the write assist circuit 14 in FIG. 1 in order to control the level of negative voltage supplied by the write assist circuit 200.

The write assist circuit 200 includes a transistor 202 which is coupled to the low voltage rail 38 ($V_{SS}$). The transistor 202 enables the discharge node 24 to be coupled to the low voltage rail 38, thus discharging the discharge node 24 to the low voltage rail 38. A write enable signal is input to the input of an inverter 204 which has an output coupled to an inverter 206. The gate of the transistor 202 is coupled to the output of the inverter 206. The output of the inverter 204 is also coupled to the input of an inverter 208. A write assist capacitor 210 is coupled between the output of the inverter 208 and the drain of the transistor 202. The write assist capacitor 210 is also coupled to a capacitor charging control circuit 212. The control circuit 212 has a transistor 214 which in this example is a p-type MOSFET. The transistor 214 has its gate and drain tied to the low voltage rail 38. A voltage regulator 216 powers the voltage output of the inverter 208.

The write assist circuit 200 is activated by a high write enable signal input to the inverter 204 which as explained above causes the transistor 202 to couple the discharge node to the low voltage rail 238. The write assist capacitor 210 is charged to the voltage level of the voltage powering the inverter 206. A low write enable signal is then applied switching off the transistor 202. After the delay caused by the inverters 204 and 208, the write assist capacitor 210 is discharged generating a pull down voltage to bring the discharge node 24 to a negative voltage ($V_{neg}$) lower than that of the low voltage rail 38.

The negative voltage generated by the capacitor 210 is controlled by both the voltage regulator 216 which controls the voltage which is supplied to the capacitor 210 from the inverter 208 (i.e., $V_{cp}$) and the control circuit 212 which limits the charge available to the capacitor 210.

Figure 4:
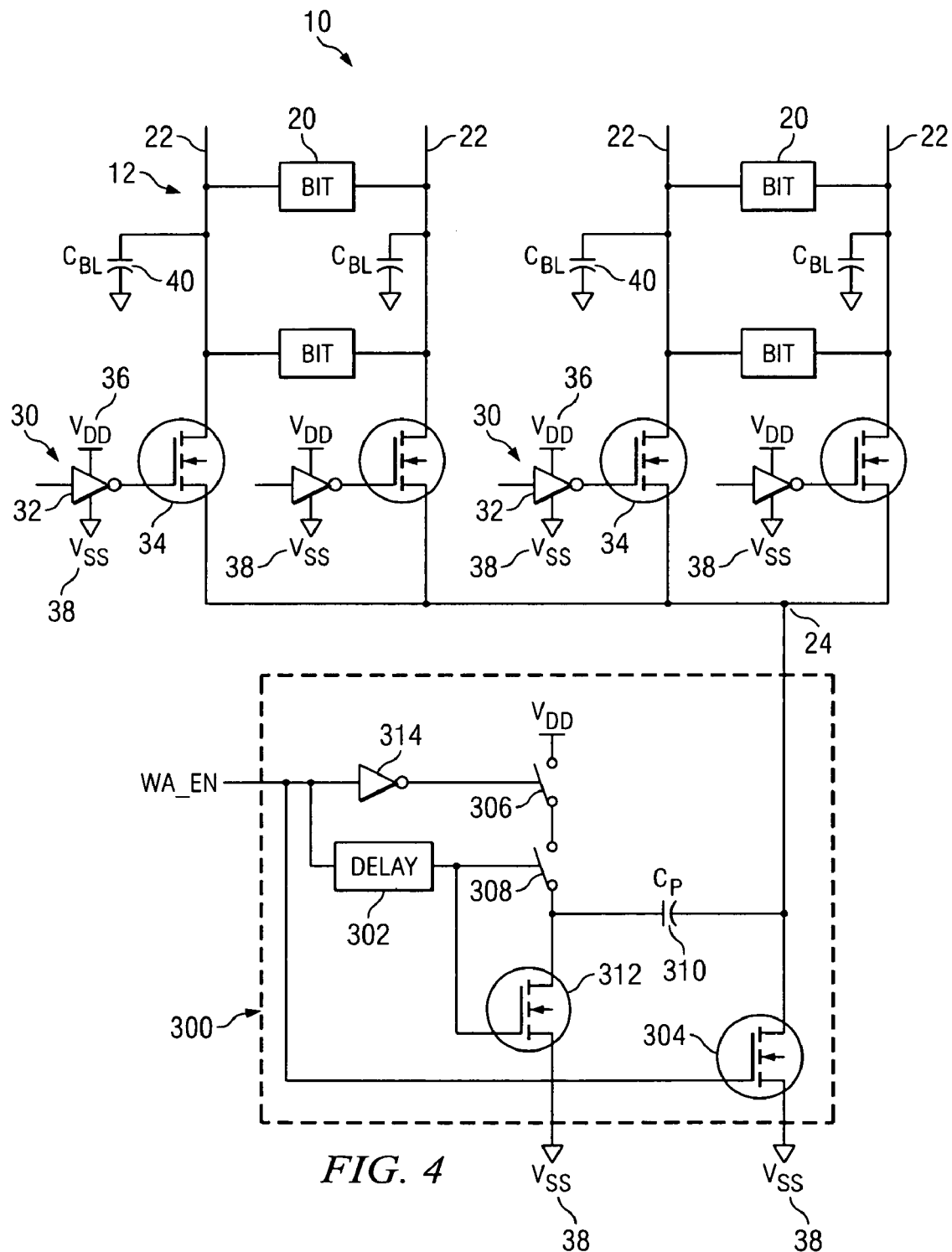
FIG. 4 is a circuit diagram of a portion of an example SRAM device including an example of a regulated voltage write assist circuit using a delay circuit.

FIG. 4 shows another example of a write assist circuit 300 which uses a delay circuit 302 to regulate the negative voltage output to memory circuit 12 which is identical to that in FIG. 1 and thus identical elements have identical element numbers. The write assist circuit 300 has a transistor 304 which is coupled to the low voltage rail 38 ($V_{SS}$). A pair of switches 306 and 308 is coupled between the high voltage rail 36 and a write assist capacitor 310. The transistor 304 enables the discharge node 24 to be coupled to the low voltage rail 38, thus discharging the discharge node 24 to the low voltage rail 38. A transistor 312 has a gate coupled to the output of the delay circuit 302. The transistor 312 is coupled between one end of the write assist capacitor 310 and the low voltage rail 38 ($V_{SS}$). An inverter 314 is coupled between the switch 306 and the input of the delay circuit 302.

A high write enable signal activates the transistor 304 which couples the discharge node 24 to be coupled to the low voltage rail 38. The switch 306 is normally open (due to the output of the inverter 314) while the switch 308 is normally closed. A low write enable signal is then input, causing the switch 306 to close and the capacitor 310 to be charged towards the high voltage rail 36. After a delay determined by 302, the switch 308 is opened and the transistor 312 discharges the capacitor 310 to the low voltage rail 38 ($V_{SS}$) resulting in a pull down voltage to be applied at the discharge node 24. By controlling the amount of delay in 302, the capacitor 310 can be partially charged to a voltage between the high and low voltage rails. The time of delay from the delay circuit 302 may be made a function of external factors to the circuit such as temperature, use, voltage etc. which may affect the voltage of the high voltage rail 36. The delay time thus allows control of the negative voltage applied.

From the foregoing, persons of ordinary skill in the art will appreciate that the above disclosed methods and apparatus may be realized within a single device or across two cooperating devices, and could be implemented by software, hardware, and/or firmware to implement the voltage regulated write assist circuit disclosed herein.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of regulating pull down voltage from a write assist circuit having a write assist capacitor coupled to a discharge node that is coupled to a bit line, a switch to receive an enable signal to couple the bit line to a low voltage rail, the method comprising:
 providing a voltage source to charge the write assist capacitor; and
 limiting the voltage produced by the voltage source to limit pull down voltage at the discharge node from the write assist capacitor.

2. The method of claim 1 further comprising limiting the write assist capacitor charge.

3. The method of claim 2 wherein a transistor having a gate tied to a drain to create a threshold voltage is coupled to the capacitor to limit the write assist capacitor charge.

4. The method of claim 1 wherein the limited voltage is a function of an external condition affecting circuit voltage.

5. The method of claim 1 wherein limiting the voltage further includes delaying the charging of the write assist capacitor for a delay period to regulate the pull down voltage at the discharge node.

6. The method of claim 5 wherein the delay period is a function of an external condition to the circuit affecting circuit voltage.

7. The method of claim 1 wherein the switch is a metal oxide semiconductor field effect transistor (MOSFET) and the write assist capacitor is the parasitic capacitance between the gate and the drain of the MOSFET.

8. A method of regulating negative voltage from a write assist circuit having a write assist capacitor coupled to a discharge node that is coupled to a bit line, and a transistor to receive an enable signal to couple the bit line to a low voltage rail, the method comprising:
providing a voltage source to charge the write assist capacitor; and
limiting the charge provided to the write assist capacitor.

9. The method of claim 8 further comprising limiting an output voltage of the voltage source.

10. The method of claim 8 wherein limiting the charge provided to the write assist capacitor includes coupling a second transistor to the write assist capacitor and coupling the gate of the second transistor to the low voltage rail to limit the charging of the write assist capacitor to a threshold voltage.

11. The method of claim 8 wherein the transistor is a metal oxide semiconductor field effect transistor (MOSFET) and the write assist capacitor is the parasitic capacitance between the gate and the drain of the MOSFET.

12. A write assist circuit for use in conjunction with a write enable signal to SRAM, the circuit comprising:
a bit access line coupled to a bit cell, the bit access line activating a write command to the bit cell;
a bit line capacitor coupled to the bit access line;
a discharge node held at the voltage of a high voltage rail coupled to the bit access line;
a transistor coupled between the discharge node and a low voltage rail, the transistor to couple the bit access line to the low voltage rail thereby activating a write to the bit cell on receiving the write enable signal;
a write assist capacitor coupled to the discharge node to pull the discharge node to a pull down voltage below the voltage of the low voltage rail; and
a circuit coupled to the write assist capacitor to vary the charge of the write assist capacitor and control the pull down voltage.

13. The write assist circuit of claim 12 further comprising an inverter powered by a voltage regulation circuit, the inverter coupled to the write assist capacitor to control the pull down voltage.

14. The write assist circuit of claim 13 wherein the voltage regulation circuit supplies voltage to the write assist capacitor as a function of an external condition of the write assist circuit.

15. The write assist circuit of claim 14 wherein the voltage regulation circuit is powered by the high voltage rail.

16. The write assist circuit of claim 14 wherein the voltage regulation circuit is powered by an independent voltage source.

17. The write assist circuit of claim 13 wherein the circuit coupled to the capacitor includes a field effect transistor including a gate and drain tied to the low voltage rail creating a threshold voltage for limiting the capacitor charge.

18. The write assist circuit of claim 12 wherein the transistor is a metal oxide semiconductor field effect transistor (MOSFET) and the write assist capacitor is the parasitic capacitance between the gate and the drain of the MOSFET.

19. A write assist circuit for use with an SRAM device with a bit access line held at a high voltage, the bit access line to activate a write to a bit cell with an activation signal to discharge the bit acess line to a discharge node, the write assist circuit comprising:
a write assist capacitor coupled to the discharge node;
a transistor coupled between the discharge node and a low voltage rail; and
a voltage circuit receiving the activation signal and coupled to the write assist capacitor to limit the voltage to charge the write assist capacitor to pull down the discharge node below the voltage of the low voltage rail.

20. The write assist circuit of claim 19 wherein the voltage to charge the write assist capacitor is limited as a function of an external condition of the SRAM.

21. The write assist circuit of claim 19 wherein the voltage circuit is an inverter coupled to a voltage regulator to limit the voltage output of the inverter.

22. The write assist circuit of claim 21 wherein the voltage regulator is powered by a high voltage rail.

23. The write assist circuit of claim 21 wherein the voltage regulator is powered by an independent voltage source.

24. The write assist circuit of claim 19 wherein the voltage circuit is a delay circuit which cuts off the voltage to charge the write assist capacitor after a delay period.

25. The write assist circuit of claim 19 wherein the transistor is a metal oxide semiconductor field effect transistor (MOSFET) and the write assist capacitor is the parasitic capacitance between the gate and the drain of the MOSFET.

26. The write assist circuit of claim 19 further comprising a second transistor having a gate coupled to the low voltage rail and a drain coupled to the write assist capacitor, the second transistor having a threshold voltage to limit the charge voltage on the capacitor.

* * * * *